United States Patent [19]
DeSanto

[11] Patent Number: 4,951,385
[45] Date of Patent: Aug. 28, 1990

[54] ELECTRICAL HARNESS ASSEMBLY APPARATUS

[76] Inventor: Joseph J. DeSanto, 14 Hillcrest Rd., Belle Mead, N.J. 08502

[21] Appl. No.: 352,764

[22] Filed: May 16, 1989

[51] Int. Cl.$^5$ .............................................. B23P 19/00
[52] U.S. Cl. ...................................... 29/754; 29/755; 29/720; 29/705
[58] Field of Search ................. 29/753, 754, 755, 705, 29/720, 407

[56] References Cited

U.S. PATENT DOCUMENTS

| | | | |
|---|---|---|---|
| 3,407,480 | 10/1968 | Hill et al. | 29/705 |
| 4,030,029 | 6/1977 | Cox | 29/755 |
| 4,277,831 | 7/1981 | Saunders et al. | 29/755 |
| 4,711,025 | 12/1987 | DeSanto | 29/854 |

*Primary Examiner*—P. W. Echols
*Attorney, Agent, or Firm*—Mathews, Woodbridge & Collins

[57] ABSTRACT

An electric wire harness assembly apparatus having a wiring board on which computer controlled lighted termination modules are mounted. The wiring surface includes wiring guides for indicating the configuration of the harness. The module is removable and is wired directly to the computerized control. An array of lights are mounted on each module to indicate to the assembler which assembly point in the harness connector is to receive the wire termination. In response to the assembly of a harness wire, a central control automatically scans the harness wires to test the harness.

18 Claims, 4 Drawing Sheets

ELECTRICAL HARNESS ASSEMBLY APPARATUS

BACKGROUND OF THE INVENTION

1. Field of the Invention

The present invention relates to the fabrication of electrical devices, and more particularly to a system for the assembly of wire harnesses.

2. Description of the Related Art

In the field of electrical circuit fabrication, it has been the general practice to employ wire assembly apparatus to assist an assembler in arranging a plurality of electrical wires and cables in a predetermined pattern so that the assembler may form a harness having a plurality of conductors that may be used as a unit. U.S. Pat. No. 4,711,025 shows a prior art electrical harness assembling apparatus. This apparatus includes a wiring board having a plurality of terminators, such as harness connectors, mounted thereon at locations where wires are to begin and end. The assembler will hand-feed individual wires one at a time between appropriate terminators and through wire guide units mounted in an array on the wiring board. Wiring information is provided to the assembler in the form of instructions displayed on a printed computer run-out or a CRT. Some errors in placing the wires on the apparatus are automatically detected and the assembler informed via multi-colored, light emitting diodes (LED). Although such devices have served the purpose, they have not proved entirely satisfactory under all conditions of service for the reason that many wiring errors go undetected until after the harness is formed and removed from the wiring board. Additionally, locating the proper wiring configuration and the location of wire connections on the board takes considerable operator time and is prone to operator translation errors of the wiring information. These problems result in unnecessarily low production. Still further, prior art systems require that the assemblers have significant knowledge of the system and the type of harness being assembled. As such, the training time for the average assembler may be significant. Therefore, those concerned with the development of electrical harness assembly equipment have long recognized the need for improvements in the system that will increase production, reduce assembler training time and reduce the causes of errors in manual harness assembly. The present invention fulfills this need.

SUMMARY OF THE INVENTION

The general purpose of this invention is to provide an electrical harness assembly apparatus wherein manual wiring errors are significantly reduced, the apparatus is user friendly thereby reducing assembler training time significantly, and production is significantly increased for both manual and automatic assembly. To attain this, the present invention contemplates a unique system of computer controlled lighted termination modules and test circuits that visually guide a assembler through the assembly operation while testing the harness as it is being formed. More specifically, the invention comprises a wiring surface having guide means for indicating the configuration of the harness to be assembled including the locations of a plurality of harness terminations, a plurality of harness terminators, such as the housing of a conventional harness connector, each mounted adjacent a different one of the locations of the harness terminations and having a plurality of assembly points for the harness wire terminators, a plurality of visual indicators such as lights mounted adjacent one of the terminators and having means for indicating the assembly points for a harness wire termination, a plurality of conductor terminals mounted adjacent each of the terminators in an array such that an assembled wire termination will contact one of the conductor terminals, and control means connected to the conductor terminals and the visual indicators for energizing the visual indicators to indicate the location of the two points of assembly for the wire terminations in the harness terminators.

An object of the present invention is the provision of a harness assembly apparatus having removable modules that include means for visually directing an assembler through the assembly operation.

Another object is to provide a harness assembly apparatus capable of testing the harness during assembly.

Other objects and many of the attendant advantages of this invention will be readily appreciated as the same becomes better understood by reference to the following detailed description when considered in connection with the accompanying drawings.

DETAILED DESCRIPTION OF THE PREFERRED EMBODIMENTS

Figure 1:
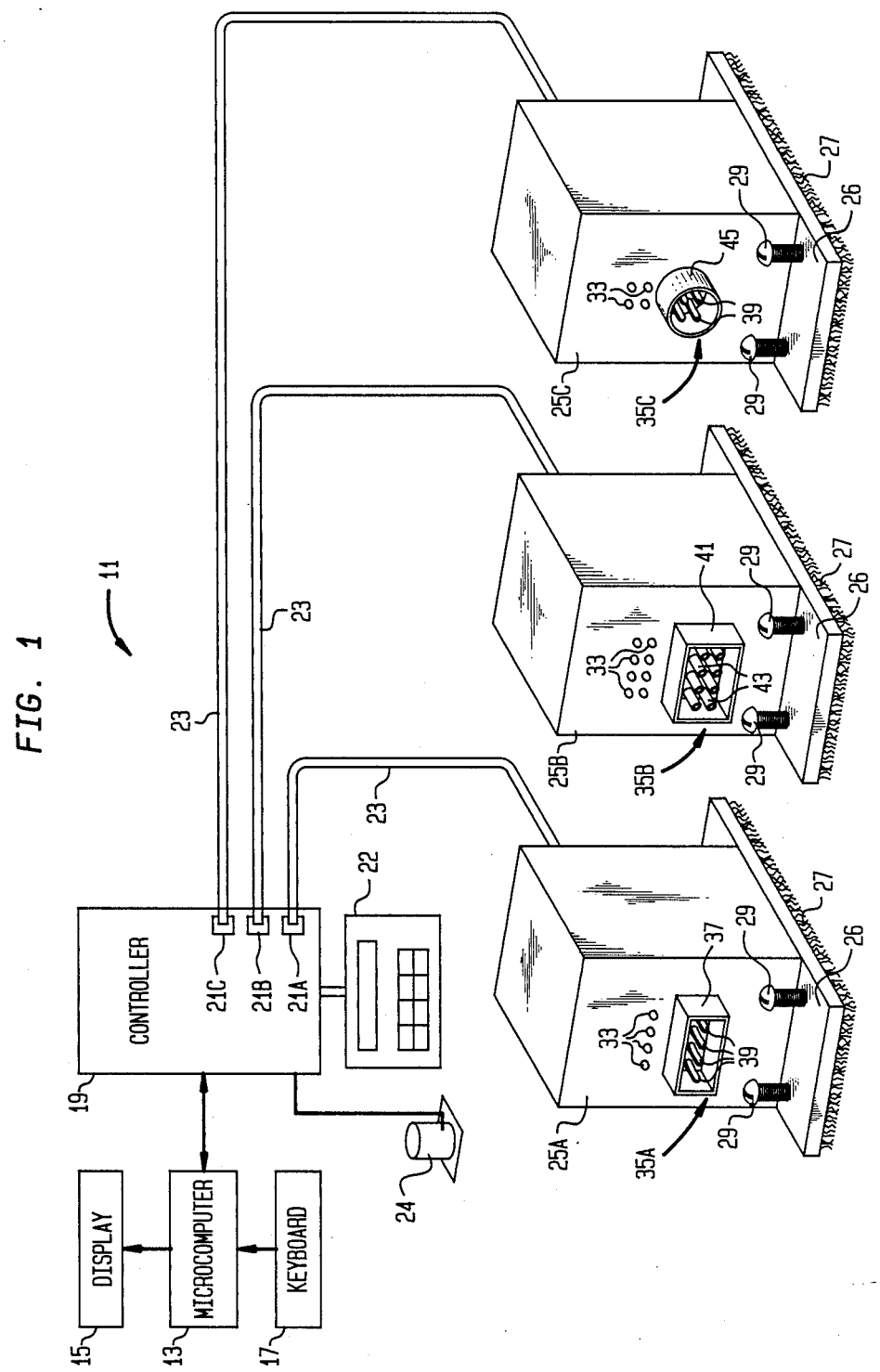
FIG. 1 shows a block diagram of a portion of the preferred embodiment.
Figure 2:
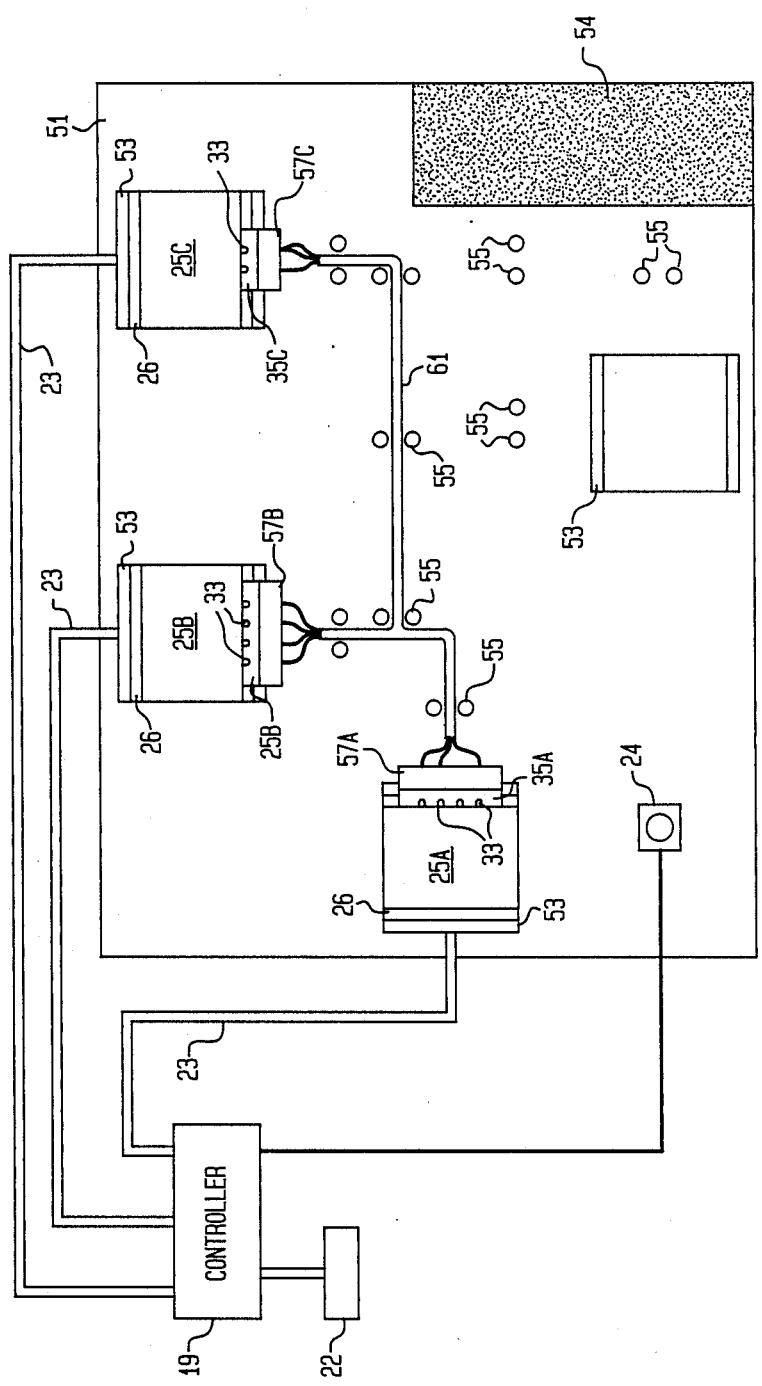
FIG. 2 is a top plan view in schematic showing a wiring board in combination with elements of FIG. 1.
Figure 5:
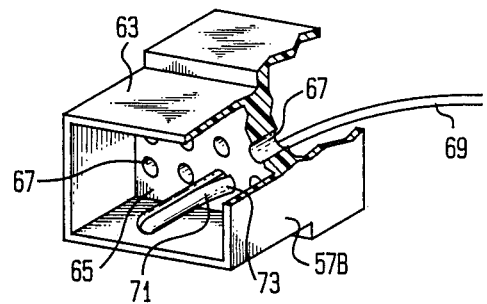
FIG. 5 is a perspective view partly in section of a prior art connector used in conjunction with the present invention.

Referring now to the drawings, wherein like reference characters designate like or corresponding parts throughout the several views, there is shown in FIG. 1 an electric harness assembly apparatus 11 comprising a microcomputer 13 connected to an output device such as the display 15 and an input device such as keyboard 17. The microcomputer 13 is connected to a station controller 19 having an input/output device 22 and a plurality of ports 21A, 21B, 21C. A plurality of lighted termination modules 25A, 25B, 25C are connected to ports 21A–21C, respectively, by cables 23. The modules 25A–25C have rigid mounting plates 26 secured thereto to permit the selective mounting of the modules 25A–25C on a wiring board 51 as seen in FIG. 2. Plates 26 include a plurality of screws 29 and a Velcro-type mating fabric 27. Each of the modules 25A–25C is shown to include a set of visual indicators in the form of light emitting diodes (LED) 33 and a fixed connector 35A–35C, respectively. A port (not shown) is provided on the back of each of the modules 25A–25C for receiving cables 23. Each of the modules 25A–25C are specifically designed to be used for assembling a harness to a particular type of harness terminator such as a connector housing of the general type shown in FIG. 5. The fixed connectors 35A–35C are the mating half of the type of connector with which the harness connector is intended to mate. For example, the fixed connector 35A has a rectangular shaped housing 37 and four male connector pins 39 arranged in a line. The corresponding connector with which the harness connector is to eventually mate will also be a four-pin male connector having a housing shaped like housing 37. Module 25B is designed for assembly of harness wires to an eight-pin connector having a rectangularly shaped housing with the pins arranged in two parallel rows of four pins each. As such, the fixed module connector 35B includes a rectangularly shaped housing 41 for holding eight female pin receiving sockets 43 in two parallel rows of four sockets 43 in each row. FIG. 5 illustrates a harness connector 57B of the type that is intended to mate with the module connector 35B. Module 25C includes a circularly shaped housing 45 having four male pins 39 mounted therein in a square array. Clearly, the fixed connectors 35A-35C may include any shape or type of connector for mounting on a harness. It is contemplated that the present invention may be used to assemble a harness with a variety of harness terminators other than the type illustrated by connectors 57A-57C.

As is also evident from FIG. 1, each module 25A-25C includes a plurality of LED's 33 equal in number to the number of connecting elements thereon, such as pins 39 and sockets 43, and arranged in an array similar to the shape of the array in which the corresponding pins 39 and sockets 43 are arranged. As will become clear later, the LED's 33 each correspond to the connecting elements, i.e., pins 39 and sockets 43, that are similarly placed in the corresponding arrays.

An electrode 24 is connected to controller 19 by a conductor. Electrode 24 is used to assist in locating connecting points in a manner to be described later.

Figure 6:
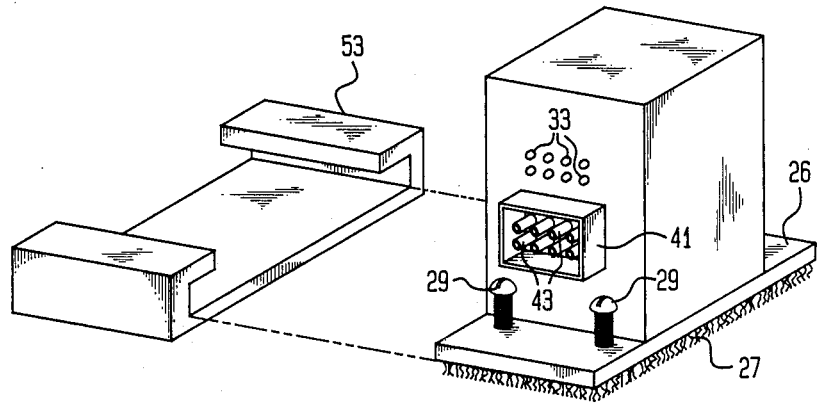
FIG. 6 is a pictorial view of a portion of the device shown in FIGS. 1 and 2.

With reference to FIGS. 2 and 6, there is shown a flat wiring board 51 having a plurality of channel-shaped securing bases 53 in which the modules 25A-25C are mounted via mounting plates 26. Screws 29 may be used to wedge the plate 26 in the base 53 (FIG. 6). Also provided is a mating fabric area 54 for cooperation with the corresponding fabrics 27 on plate 26 for mounting modules 25A-25C. A plurality of vertical pins 55 are secured to the board 51 to form channels in which the wires that form harness 61 are placed. In the example shown in FIG. 2, the harness 61 includes a plurality of wires bunched as a unit between pins 55 to form three branches that terminate in harness connectors 57A, 57B and 57C. Each wiring board 51 may be designed to be used for producing a unique harness or a variety of different harnesses. For example, in constructing the harness 61 only three modules 25A-25C were used while the board 51 is capable of holding up to four modules in bases 53 and others on fabric 54.

The computer 13 is used to generate a "run list" and to down load information to the controller 19. The controller 19 is designed to cooperate with the modules 25A-25C to guide an assembler during the assembly operation via display 15, input/output device 22 and LED's 33. Not only will the assembler be informed of the proper type of wire, the proper "end part" connecting element, the wire color, the bin number where the wire may be found, the proper "from" and "to" modules 25A-25C between which the wire is to be strung and the proper connecting elements 31 and 43, but the assembler will be immediately notified before the final fixing of the wire in a connector as to whether the wire is being properly placed and whether or not the wire is properly formed.

The assembler first places the proper modules 25A-25C on the wiring board 51 at the appropriate location, either in a base 53 or at a specified position on board surface 54. The assembler can acquire this information from display 15. The computer 13 has stored therein a data base that correlates the various types of harnesses to be constructed with the corresponding initial information needed by the assembler, i.e., the type of wiring board 51, the corresponding types of modules 25A-25C, the module placement on the wiring board 51 and the types of connectors 57A-57C to be placed on fixed connectors 35A-35C.

A sample prior art connector 57B capable of mating with fixed connector 35B is shown in detail in FIG. 5. The connector 57B has an outer rectangular housing 63 formed of four perpendicular walls open at either end and enclosing a partition 65 having eight bores 67 formed therein in an array that matches the array of sockets 43 in fixed connector 35B. The outer walls 63 are dimensioned to slide into the housing 41 in fixed connector 35B such that the bores 67 align with the sockets 43. A wire 69, having a pin connecting element 71 mounted thereon, is shown fully inserted into one of the bores 67. The element 71 has a sliver of metal bent to form a leaf spring 73 that is compressed when the element 71 is inserted into bore 67 and then snaps into locking engagement with the partition 65 to help lock the wire into connector 57B when fully assembled.

After placing the modules 25A-25C in their proper base 53, the assembler selects an appropriate mating connector, such as the connector 57B in FIG. 5, and places it onto the fixed connectors 35A-35C. It is the object of the assembly process to place preformed wires, such as wire 69, into the proper bores 67 in the manner shown in FIG. 5. Instructions for accomplishing this process are relayed to the assembler by way of the LED's 33 and the input/output device 22.

Figure 4:
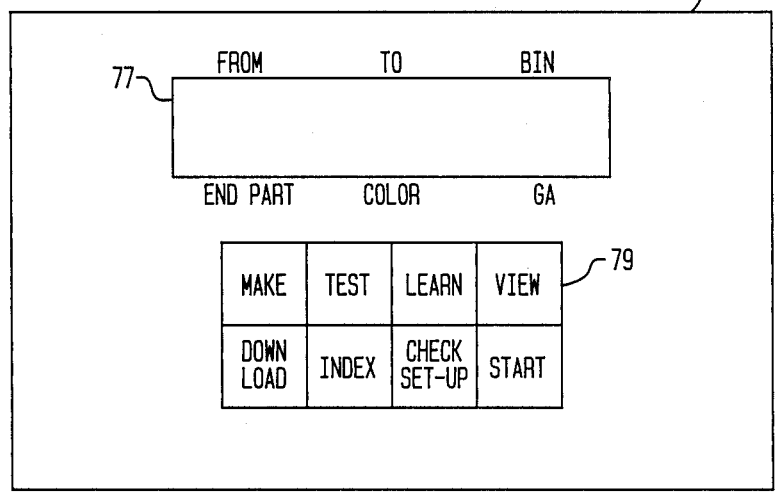
FIG. 4 is a plan view showing details of a portion of the device shown in FIG. 1.

The console 75 (FIG. 4) for the input/output device 22 includes a display 77 on which information is displayed that is inputted from the controller 19. The display 77 will display the identification of which of the modules 25A-25C are the "FROM" module and the "TO" module. For example, if module 25A is identified as the "FROM" module and module 25B is identified as the "TO" module, this indicates to the assembler that a wire, such as wire 69, will be strung from module 25A to module 25B. The proper wire will be found in the bin whose number is found below "BIN" on display 77. The "END PART" section of display 77 will indicate the type of connecting element that is to be placed in the "FROM" module, i.e., module 25A in the present example. Since module 25A has male pins 39 in its fixed connector 35A, the "END PART" in this case will indicate the part number for a female socket. The color and wire gauge are indicated on screen 77 above the symbols "COLOR" and "GA", respectively. The assembler should expect to find the wire identified by "END PART", "COLOR" and "GA" in the bin whose number is under "BIN".

It is pointed out here that the eight areas 79 located below the display 77 represent manual input keys that the assembler presses to perform various functions to be described below in detail. For now, it is sufficient to state that before assembly the assembler would have first pressed the switch "MAKE" to inform the controller that it was desired to begin assembling a harness. In response, the controller 19 will request if a standard "MAKE" operation is desired, at which time the assembler will press "START" to indicate that a standard assembly operation is requested. At this point, the display 77 will proceed to display the assembly information described above. Simultaneously, the controller 19 will selectively light the LED's 33 on the "FROM" and "TO" modules, i.e., modules 25A and 25B in the present example to indicate which pin 39 on module 25A is the "FROM" pin and which socket 43 on module 25B is the "TO" socket. At this point, the assembler will partially insert the proper ends of the wire 69 in the bores 67 that correspond to the "FROM" and "TO" LED's 33 until the connecting element makes sufficient electrical contact with the appropriate pin 39 or socket 43. At this point, the illuminated LED's 33 will respond in one of three ways. If both the "FROM" and "TO" LED's 33 go out, this response indicates that the assembler made the proper connection with the proper wire and that the wire did not have an open (possibly caused by a break) or a short (possibly caused by a loose wire strand or whisker crossing over to an adjacent wire at the connector). Also, when both LED's 33 go out, two new LED's 33 will be illuminated and the display 77 will change the information thereon to indicate the necessary information for the next connection. If the "FROM" and "TO" LED's 33 remain on and nothing else happens, that indicates that there is an open in the wire 69. The assembler may correct this condition by selecting a replacement wire 69.

The third possibility is that the placement of the "TO" or "FROM" end of wire 69 is improperly placed or there is a short. In this situation, an additional LED 33 on either the "FROM" or "TO" modules 25A, 25B, respectively, or both will be illuminated. The assembler may correct this condition by replacing the wire in the connector properly.

Figure 3:
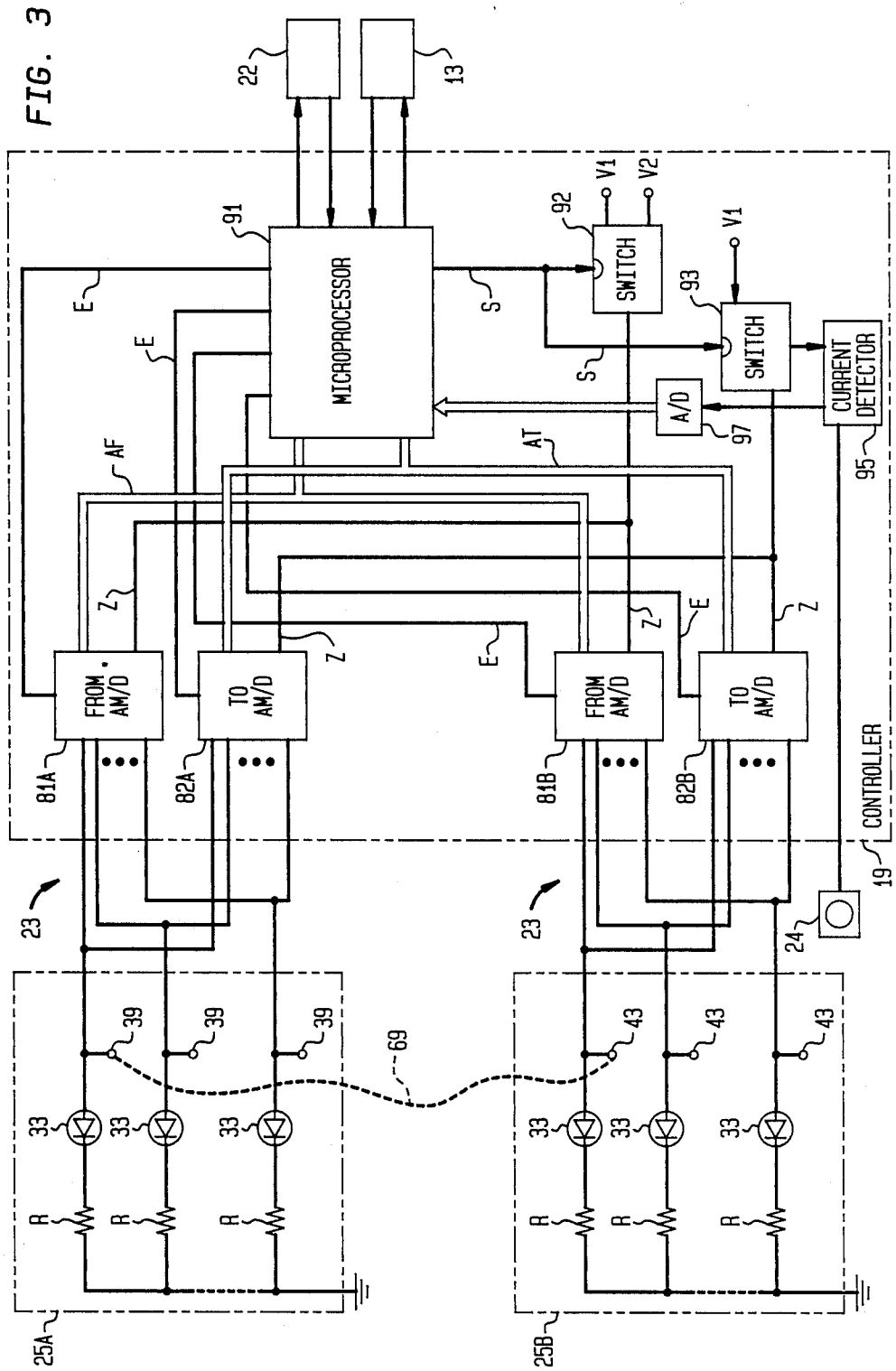
FIG. 3 is an electrical schematic diagram showing details of the device shown in FIG. 1.

The preferred circuit for accomplishing the functions just described is illustrated in FIG. 3. Although in FIG. 3 only two modules, i.e., modules 25A and 25B, are illustrated, it is understood that any number of modules may be provided. The modules 25A and 25B each include a plurality of LED's 33 each connected in series with a terminal of a resistor R that has its other terminal grounded preferably through a wire in cable 23. The LED's 33 are each connected to a different pin 39 in module 25A, and to a different socket 43 in module 25B. The pins 39 and sockets 43 are each connected to a different conductor in the corresponding cable 23. At the controller 19, the cables 23 are connected to input-/output terminals on analog multiplexer/ demultiplexers (AM/D) 81A, 82A, 81B, 82B. Each AM/D 81A, 81B is connected to a "FROM" address bus AF and each AM/D 82A, 82B is connected to a "TO" address bus AT. Address busses AT and AF are connected at their other end to a microprocessor 91. Each AM/D 81A-82B is connected to the microprocessor 91 by enable lines E. A pair of switches 92, 93 are controlled by the microprocessor 91 via switching line S. The switch 92 is connected to each of the "FROM" AM/D's 81A, 81B and to two voltage sources V1 and V2. As such, the switch 92 is capable of applying either the voltage V1 or V2 to all of the "FROM" AM/D's 81A, 81B under the control of microprocessor 91 via line S. Switch 93 is connected to each of the "TO" AM/D's 82A, 82B, to the voltage source V1 and to a current detector 95. As such, switch 93 is capable of applying voltage V1 to each of the "TO" AM/D's 82A, 82B. The output of detector 95 is connected to an analog-to-digital converter 97 which in turn is connected to microprocessor 91.

The operation of the FIG. 3 circuit is as follows: The microprocessor 91 will receive information, sometimes called a "run list", from computer 13 containing the assembly parameters that describe which wires 69 should be threaded between which modules to form the desired harness. After receiving the necessary harness assembly parameters from computer 13 and after receiving an appropriate input from I/O device 22, initiated by the assembler pressing the "MAKE" and "START" switches, the microprocessor 91 will proceed with the assembly. At this point computer 13 may be disconnected and made available for other uses. Microprocessor 91 first enables a "FROM" module and a "TO" module via two enable lines E. For example, if a wire to be assembled is to be strung from a pin 39 on module 25A to a socket 43 on module 25B, the microprocessor 91 will enable the "FROM" AM/D 81A and the "TO" AM/D 82B via the appropriate enable lines E. Simultaneously, the microprocessor 91 will also apply a "FROM" address on bus AF and a "TO" address on bus AT. Each of the AM/D's 81A-81B, a conventional device, includes a plurality of bidirectional analog switches that connect to one of the lines of cable 23, as dictated by the address on the "TO" and "FROM" address buses AT and AF, to the corresponding Z lines. In the present example, assume that the assembly operation is at a stage where the next wire to be assembled on wire board 51 is to extend from the top pin 39 in FIG. 3 to the top socket 43 in FIG. 3. At this point, the microprocessor will enable "FROM" AM/D 81A and "TO" AM/D 82B via the appropriate enable lines E. As such, all other AM/D's, e.g., "TO" AM/D 82A and "FROM" AM/D 81B, will remain disabled. Also, microprocessor 91 will transmit (by applying voltages, for example) on lines AF the address of the line in cable 23 that is connected to the top pin 39, and transmit on lines AT the address of the line in cable 23 that is connected to the socket 43. Because only AM/D's 81A and 82B are enabled, the address signals on lines AT and AF which are connected to all AM/D's will effect only those AM/D's that are enabled. At this point, the addressed lines in cable 23 will now be connected to the Z line, thereby connecting the voltages V1 to the top pin 39 and the top socket 43 via the switches 92 and 93, respectively, the Z lines, the AM/D's 81A and 82B, respectively, and the appropriate lines in cables 23. This action also causes the voltage V1 to energize the top LED's 33 in modules 25A and 25B as seen in FIG. 3. The assembler will now recognize that the corresponding pin 39 and socket 43 are the two points between which the next wire is to be strung. As an additional feature, the top of each of the modules 25A-25D could also be equipped with an LED that is illuminated like a beacon when the associated module is either a "FROM" or "TO" module. This "beacon" light would act as a prominent guide to the assembler. Information as to which module 25A or 25B is the "FROM" module and the "TO" module will also be transmitted to the display 77 along with the bin number, the color, gauge and "END PART" to indicate the type of connecting element to be placed in the "FROM" module. The assembler will now select the proper wire from the bin and place the appropriate end partially in the connectors 57A and 57B so as to make sufficient contact with the top pin 39 and top socket 43 as seen in FIG. 3. As the assembler performs this operation, the microprocessor 91 will be periodically energizing switches 92 and 93 so that for a short interval the voltage V1 is removed and the voltage V2 is applied to the line Z of the enabled "FROM" AM/D 81A. Also, the line Z of the enabled "TO" AM/D 82B is connected to the detector 95 and the voltage V1 is removed. If a wire has been assembled between the top pin 39 and the top socket 43, the change in voltage from V1 to V2 caused by switch 92 will be sensed by detector 95 via the low resistance path from switch 92, line Z, "FROM" AM/D 81A, cable 23, top pin 39, the assembled wire 69, top socket 43, cable 23, "TO" AM/D 82B, the Z line, switch 93 and current detector 95. On the other hand, if an assembled wire 69 has not yet been correctly assembled or if a properly assembled wire 69 is open (due to a wire break, for example), the current detector 95 will not detect the presence of current flow in the wire 69 since there will be an open circuit between top pin 39 and top socket 43. The detected current value sensed by detector 95 is encoded in A/D 97 and sent to microprocessor 91. When microprocessor 91 receives a value from A/D 97 indicating that an assembled wire 69 has been properly placed, it will remove the enable signals on lines E and the address signals on lines AT and AF thereby causing the light from the LED's 33 to go out. The process is now repeated for the next wire to be assembled. However, if the detector 95 detects a current level indicative of an open, meaning that the wire has yet to be properly assembled or the assembled wire is open, the microprocessor 91 will simply continue to apply the voltages V1 to keep the LED's 33 lit while periodically sampling the circuit via voltage V2 and detector 95. For a situation in which the assembler has misassembled the wire by, for example, connecting the wire between the bottom pin 39, an error, and the bottom socket 43, an error, the LED's 33 will continue to light. For a situation in which the wire misassembly involved connecting a wire from the top pin 39, a correct "FROM" connection, to the bottom socket 43, an erroneous "TO" connection, two LED's 33 will be lit on the "TO" module 25B. The same type of response will occur if the "TO" connection is correct and the "FROM" connection is in error. As such, when one connection is correct and the other connection is in error, the module having the erroneous connection will have two LED's 33 illuminated. In all cases, the microprocessor 91 will not move on to the next wire in the internally stored "run list" until a proper signal from A/D 97 is received indicating a substantially zero resistance has occurred between the "FROM" and "TO" connections.

As an additional feature of the present invention, a scanning sequence may be added to the functions of the microprocessor 91 wherein a continuity test is conducted on each of the harness wires 69 that have been previously assembled. It is contemplated that this test be initiated by the microprocessor 91 after receiving a signal from A/D 97 that the last-assembled wire 69 was properly assembled. At this point, the microprocessor 91, guided by the stored "run list", will sequentially enable and address each previously assembled point via enable lines E and address lines AF, AT while simultaneously applying voltages and sensing currents via switches 92, 93, and detector 95. If an open is sensed by detector 95, the microprocessor 91 will stop the process and return to the normal assembly mode and the corresponding LED's 33 associated with the detected open will be illuminated. The problem is corrected by the assembler and the microprocessor 91 proceeds again to scan all previously assembled wires 69. When all scanned wires 69 are sensed as being properly connected, the microprocessor 91 will proceed with the stored "run list" and illuminate the two LED's 33 that correspond to the connecting points of the next wire 69 to be assembled.

As an additional feature, it is contemplated that the present embodiment use the scanning ability of the microprocessor 91 to analyze a previously assembled harness to program a "run list" in the microprocessor 91. This feature is referred to as the learn mode and is initiated by the user by depressing the "LEARN" key on the I/O device 22. Prior to initiating the learn mode, the assembler will mount a previously assembled harness on the wiring board 51 by connecting the harness to the proper connectors 35A–35C on modules 25A–25C. In response to depressing the "LEARN" key on device 22, the microprocessor 91 scans the harness by sequentially enabling each AM/D 81A–82B while addressing each possible combination ad permutation of possible "FROM" and "TO" addresses via lines AF and AT. As the harness is being scanned, currents will be transmitted over the lines Z to switch 93 and current detector 95 at those times when a harness wire is connected between the points being addressed by microprocessor 91. This information is transmitted to microprocessor 91 from detector 95 via A/D 97. The microprocessor 91 uses the output of A/D 97 to program a "run list" therein.

In the random mode of assembly, the assembler starts with a harness having one end of the wire terminations already assembled in a proper connector, e.g., connector 57B (FIG. 5). The assembler uses this mode to connect the non-assembled terminations in the proper connectors 57A–57C. In this mode, the assembler first mounts the assembled connectors 57A–57C in the proper module connectors 35A–35C and then randomly selects a non-assembled wire termination and makes electrical contact between the termination and the electrode 24. The microprocessor 91, while in this mode, again uses the scanning function to sequentially address each pin 39 and socket 43 to locate the other end of the randomly selected wire that has its non-assembled termination contacting electrode 24. Microprocessor 91 again detects the output of A/D 97 when detector 95 senses a current on line Z caused by the voltage on electrode 24. At this point, the microprocessor stops scanning and, using the previously stored "run list", determines the address of the proper pin 39 or socket 43 on which the non-assembled wire termination is to be assembled. Next, the microprocessor 91 enables the proper AM/D 81A–82B and applies the proper address to address lines AF and AT thereby energizing the proper LED 33 to indicate the location of the proper pin 39 or socket 43. When the wire is properly assembled and tested by microprocessor 91, the scanning process continues by microprocessor 91 and the assembler randomly chooses another non-assembled wire termination. The cycle is repeated until the entire harness is assembled, at which time the assembler may remove the harness from the connectors 35A–35C and the board 51.

The keys 79 are used to perform the following functions: Depressing the "MAKE" key causes the microprocessor 91 to enter the make mode as described above. Before entering the make mode, microprocessor 91 displays a message on screen 77 asking the assembler if a standard or sequential make mode is desired, or if a random make mode, using electrode 24 is desire. The user responds by depressing either the "START" key or "INDEX" key, as instructed by display 77, for the standard mode or random mode, respectively. The "VIEW" key is used to cause the microprocessor 91 to display the stored "run list" on screen 77 one wire assembly instruction at a time. The user advances through the "run list" by depressing the "INDEX" key. The "DOWNLOAD" key is used to cause the computer 13 to download the "run list" into the microprocessor 91. Once the "run list" has been downloaded, the computer 13 may be disconnected from controller 19. The "LEARN" key is used to enter the learn mode as described above. Also, the "TEST" key is used to enter the test mode wherein an already assembled harness is tested. In response to depressing the "TEST" key, the microprocessor 91 will query the user as to which test is desired, the single scan test or the loop test. Errors encountered during the test are stored in memory by the microprocessor 91 and display on screen 77 when the user depresses the "INDEX" key. The "CHECK SET-UP" key is sued to perform a self test on the microprocessor 91 and related equipment.

It should be understood, of course, that the foregoing disclosure relates to only preferred embodiments of the invention and that numerous modifications or alterations maya be made therein without departing from the spirit and the scope of the invention as set forth in the appended claims.

What is claimed is:

1. An electric wire harness assembly apparatus comprising:
   a wiring surface having guide means for indicating the configuration of the harness to be assembled including the locations of a plurality of harness terminations;
   a plurality of termination modules each mounted adjacent a different one of the locations of the harness terminations;
   a plurality of harness terminators each mounted on one of the modules and having a plurality of assembly positions each for receiving a harness wire termination;
   a plurality of visual indicators each mounted on one of the modules adjacent one of the terminators, and each of the visual indicators having means for indicating which ones of the assembly positions is to receive a harness wire termination during assembly of a harness wire;
   a plurality of conductor terminals mounted on the modules adjacent each of the terminators in an array such that each assembled harness wire termination will contact a different one of the conductor terminals; and
   control means connected to said conductor terminals and said visual indicators for energizing said visual indicators to indicate the location of two positions of assembly for the wire terminations in said harness terminators.

2. The apparatus of claim 1 further including means for removably mounting the modules on the wiring surface.

3. The apparatus of claim 2 wherein said means for removably mounting the modules includes a rigid plate fixed to said module, a channel fixed to said wiring surface in which said plate is slidably inserted, and means for selectively securing said plate in said channel.

4. The apparatus of claim 2 wherein said means for removably mounting the modules includes a rigid plate fixed to said module and a first mateable material mounted on the plate and a second mateable material mounted on said surface having means for removably securing the materials to each other.

5. The apparatus of claim 4 wherein one of the materials has a plurality of hooked fibers and the other of said materials has a plurality of looped fibers that securingly mate with the hooked fibers.

6. The apparatus of claim 2 wherein said control means includes detector means for periodically sensing that a wire has been properly assembled between two of the conductor terminals wherein said detector means both senses and energizes said visual indicators over a common conductor.

7. The apparatus of claim 6 wherein said control means includes means responsive to the detector means for causing said control means to energize a selected pair of the visual indicators until a wire is properly assembled between a pair of conductor terminals.

8. The apparatus of claim 7 wherein said control means includes scan means for causing said detector means to periodically scan all previously assembled wires to sense that each of the previously assembled wires is properly assembled.

9. The apparatus of claim 8 wherein said scan means causes said detector means to scan upon the proper assembly of each wire.

10. The apparatus of claim 2 wherein said visual indicators include a plurality of lights each light associated with a different one of said conductor terminals.

11. The apparatus of claim 10 wherein said lights are light emitting diodes.

12. The apparatus of claim 11 wherein said light emitting diodes are arranged in an array similar to the array of the associated conductor terminals.

13. The apparatus of claim 12 wherein each light emitting diode is located in the array where the corresponding point in the associated conductor terminal is located.

14. The apparatus of claim 13 wherein said control means includes detector means for sensing that a wire has been properly assembled between two of the conductor terminals.

15. The apparatus of claim 14 wherein said control means includes means responsive to the detector means for causing said control means to light a selected pair of the diodes until a wire is properly assembled between a pair of conductor terminals.

16. The apparatus of claim 15 wherein said control means includes scan means for causing said detector means to periodically scan all previously assembled wires to sense that each of the previously assembled wires is properly assembled and wherein a common conductor is used to provide a path for energizing said diodes and scanning said assembled wires.

17. The apparatus of claim 16 wherein said scan means causes said detector means to scan upon the proper assembly of each wire.

18. The apparatus of claim 2 wherein said harness terminators include harness connectors having a housing mounting a plurality of wire terminations.

* * * * *